United States Patent
Uji et al.

(10) Patent No.: US 7,636,217 B2
(45) Date of Patent: Dec. 22, 2009

(54) DEFECT INSPECTION METHOD OF MAGNETIC DISK, DEVICE THEREFOR, AND MAGNETIC DISK DRIVE DEVICE

(75) Inventors: Yoshiaki Uji, Tokyo (JP); Fujio Harako, Kanagawa (JP); Minoru Shimada, Kanagawa (JP); Ryoh Miura, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 307 days.

(21) Appl. No.: 11/900,708

(22) Filed: Sep. 12, 2007

(65) Prior Publication Data

US 2008/0072692 A1 Mar. 27, 2008

(30) Foreign Application Priority Data

Sep. 12, 2006 (JP) ............................. 2006-247349

(51) Int. Cl.
*G11B 5/09* (2006.01)
(52) U.S. Cl. ........................................................ 360/53
(58) Field of Classification Search ................... 360/53, 360/60, 59, 31, 25
See application file for complete search history.

(56) References Cited

U.S. PATENT DOCUMENTS

| | | | | |
|---|---|---|---|---|
| 5,527,110 A | * | 6/1996 | Abraham et al. | 374/5 |
| 5,810,477 A | * | 9/1998 | Abraham et al. | 374/7 |
| 6,019,503 A | * | 2/2000 | Abraham et al. | 374/4 |
| 6,104,557 A | * | 8/2000 | Kasai et al. | 360/46 |
| 6,239,936 B1 | * | 5/2001 | Abraham et al. | 360/75 |
| 6,262,572 B1 | * | 7/2001 | Franco et al. | 324/212 |
| 6,266,199 B1 | * | 7/2001 | Gillis et al. | 360/31 |
| 6,310,739 B1 | * | 10/2001 | McEwen et al. | 360/25 |
| 6,311,551 B1 | * | 11/2001 | Boutaghou | 73/105 |
| 6,353,315 B1 | * | 3/2002 | Egan et al. | 324/212 |
| 6,976,196 B2 | * | 12/2005 | Watanabe | 714/718 |
| 7,545,594 B2 | * | 6/2009 | Olson | 360/53 |
| 2006/0109000 A1 | * | 5/2006 | Makino et al. | 324/212 |
| 2007/0127147 A1 | * | 6/2007 | Yokohata et al. | 360/31 |
| 2007/0127148 A1 | * | 6/2007 | Yokohata et al. | 360/31 |
| 2007/0146920 A1 | * | 6/2007 | Kitamura et al. | 360/53 |
| 2008/0100966 A1 | * | 5/2008 | Ozeki | 360/235.4 |

FOREIGN PATENT DOCUMENTS

JP 06-309636 11/1994
JP 2004-185783 7/2004

* cited by examiner

*Primary Examiner*—Fred Tzeng
(74) *Attorney, Agent, or Firm*—Townsend and Townsend and Crew LLP; Patrick Duncan

(57) ABSTRACT

Embodiments of the present invention efficiently conduct a test for detecting defects on a magnetic disk more accurately. According to one embodiment, a HDD carries out defect inspection of a magnetic disk using thermal fly height control (TFC). Changing a clearance by the TFC achieves defect inspection tests under varied test conditions without much decrease of throughput in manufacturing HDDs. First, a self analysis test (SAT) is carried out in a state that a heater power of P2 is supplied to a heater. Then, another SAT is carried out in a state that a heater power of P1 is supplied to the heater. The heater power P2 is larger than the heater power P1.

13 Claims, 8 Drawing Sheets

DEFECT INSPECTION METHOD OF MAGNETIC DISK, DEVICE THEREFOR, AND MAGNETIC DISK DRIVE DEVICE

CROSS-REFERENCE TO RELATED APPLICATION

The instant nonprovisional patent application claims priority to Japanese Patent Application No. 2006-247349 filed Sep. 12, 2006 and which is incorporated by reference in its entirety herein for all purposes.

BACKGROUND OF THE INVENTION

Disk drive devices using various kinds of disks, such as an optical disk, a magneto-optical disk, and a flexible magnetic disk, have been known in the art. In particular, a hard disk drive (HDD) has been widely used as a storage device of a computer and has been one of indispensable disk drive devices for current computer systems. Moreover, the HDD has found widespread application such as a removable memory used in a moving image recording/reproducing apparatus, a car navigation system, a cellular phone, or a digital camera, as well as the computer, due to its outstanding characteristics.

Such all HDD requires high reliability. Therefore, a step of inspecting a surface of the magnetic disk for defects is required in its manufacturing process. As an example of the inspection of the magnetic disk, there is a test where the HDD itself detects defects of the magnetic disk therein. For example, the HDD writes data on each data track of the magnetic disk and reads the written data for locating defects in the magnetic disk. This test is performed over the whole surfaces of the respective recording surfaces of the HDD. The detected defect sectors are registered in a defect table. Then, the HDD does not access the defect sectors recorded in the defect table but skip them.

The HDD is specified to be used within a specific temperature range and a specific altitude (air pressure) range in its specification. A clearance between a head and a disk (a gap between a head and a disk) changes according to the ambient temperature and the altitude (air pressure). Specifically, the clearance increases as the temperature becomes lower, and decreases as the altitude becomes higher. An inspection by the HDD under a specific condition may cause overlooking any defects possibly appearing under at different condition. Therefore, the inspection for detecting defects of the magnetic disk is preferably performed according to the variable clearance. For example, changing the fly-height of a head slider is disclosed in Japanese Patent Publication No. 6-309636 ("Patent Document 1"), by performing the defect inspection of the magnetic disk in an atmosphere under a reduced pressure.

As described above, changing the temperature or the air pressure has conventionally been required for the defect detection inspection of the magnetic disk under various clearance conditions. However, because the defect detection inspection of the magnetic disk is carried out while the HDD is placed inside a chamber, the tests involving changing temperature or air pressure require much time and equipment.

BRIEF SUMMARY OF THE INVENTION

An object in accordance with embodiments of the present invention is to efficiently conduct a test for detecting defects on a magnetic disk more accurately. According to the particular embodiments of FIGS. 3 and 4, all HDD 1 carries out defect inspection of a magnetic disk 11 using thermal fly height control (TFC). Changing a clearance by the TFC achieves defect inspection tests under varied test conditions without much decrease of throughput in manufacturing HDDs. First, a surface analysis test (SAT) is carried out in a state that a heater power of P2 is supplied to a heater 124. Then, another SAT is carried out in a state that a heater power of P1 is supplied to a heater 124. The heater power P2 is larger than the heater power P1.

DETAILED DESCRIPTION OF THE INVENTION

Figure 1:
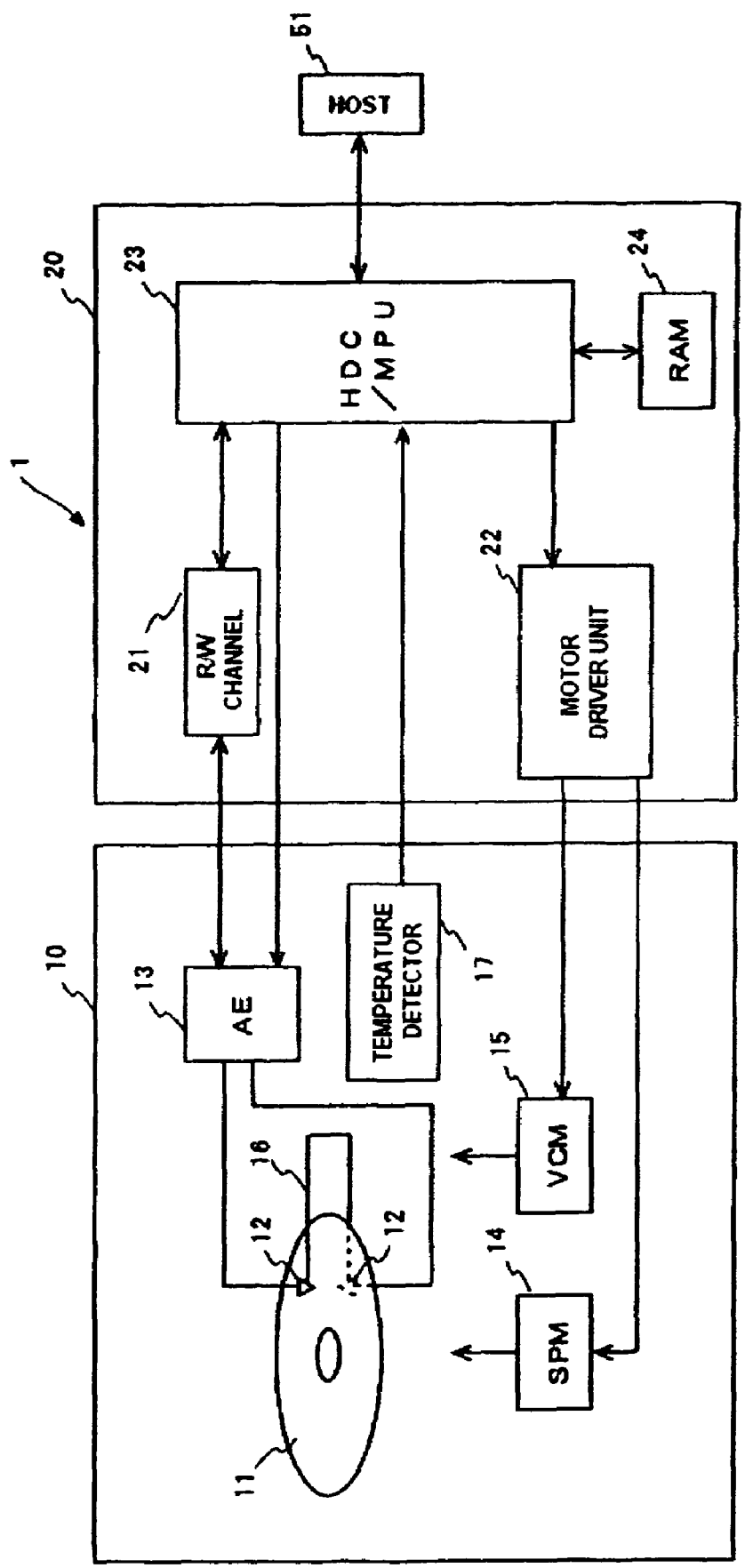
FIG. 1 is a block diagram schematically showing the configuration of the entire hard disk drive according to embodiments of the invention.

Embodiments of the present invention relate to a defect inspection method of a magnetic disk, a device therefore and a magnetic disk drive device, in particular, to defect inspection of the magnetic disk using a function of controlling a clearance between a head and the magnetic disk.

An aspect of embodiments of the present invention is a method for inspecting a magnetic disk for defects in a magnetic disk drive device including a slider flying over a rotating magnetic disk, a head element portion placed on the slider, a heater placed on the slider and making the head element portion protrude by a thermal expansion to adjust a clearance between the magnetic disk and the head element portion. This method conducts a defect inspection of a recording surface of the magnetic disk with the head element portion accessing the recording surface in a state that a heater power value of the heater is a first value. And then, it conducts a defect inspection of the recording surface of the magnetic disk with the head element portion accessing the recording surface in a state that the heater power value of the heater is a second value which is different from the first value. Conducting inspections with different heater power values enables effective detection of defects on the magnetic disk more accurately.

The defect inspection with the second value may be conducted with respect to a part of the region selected from the region on which the defect inspection with the first value was conducted. This enables more accurate detection of scratches which were not detected.

The part of the region may be selected based on a result of the defect inspection with the first value. Besides, the part of the region is selected based on a density of the defects which are detected in the defect inspection with the first value. Thereby, a more appropriate region can be selected. In addition, it is preferable that at least a part of the defects detected in the inspection in the state that the heater power of the heater is the first value is preliminarily registered as defect candidates. This achieves suppression of occurrence of defects after the inspection as well as reducing the registration number as the defects.

The first value may be larger than the heater power value at a normal operation of the magnetic disk drive device at the same temperature as the inspection and the second value is preferably smaller than the heater power value at the normal operation of the magnetic disk drive device at the same temperature as the inspection. Thereby, overlooking detection of defects can be reduced effectively.

Another aspect of embodiments of the present invention is a device for inspecting the magnetic disk for defects. The device includes a slider laying over a rotating magnetic disks a head element portion placed on the slider, a healer placed on the slider and making the head element portion protrude by a thermal expansion to adjust a clearance between the magnetic disk and the head element portion, and a controller. The controller conducts a defect inspection of the magnetic disk with the head element portion accessing a recording surface of the magnetic disk in at state that a heater power value of the heater is a first value, and further conducts a defect inspection of the recording surface with the head element portion accessing the recording surface in a state that a heater power value of the heater is a second value which is different from the first value. Conducting inspections with different heater power values enable detection of defects on the magnetic disk effectively and more accurately.

A magnetic disk drive device according to yet another aspect of embodiments of the present invention includes a slider flying over a rotating magnetic disk, a head element portion placed on the slider, a heater placed on the slider and making, the head element portion protrude by a thermal expansion to adjust a clearance between the magnetic disk and the head element portion, and a controller conducting a defect inspection of the magnetic disk with the head element portion accessing the magnetic disk in a state that a heater power value of the heater is different from a heater power value at a normal operation. Conducting the defect inspection of the magnetic disk with the heater power value different from the heater power value at the normal operation enables more accurate defect detection.

The heater power value at the defect inspection may be smaller than the heater power value at the normal operation. Thereby, defects grown with elapse of the time can be effectively detected. Besides, it is preferable that the controller conducts the defect inspection of sectors preliminarily registered as defect candidates. Thereby, more effective and accurate defect detection can be achieved.

According to embodiments of the present invention, more accurate inspection for detecting defects of the magnetic disk can be performed efficiently.

Hereafter, a preferred embodiment of the present invention is described. For clearness of explanation, the following description and the accompanying drawings contain omissions and simplifications as appropriate. Throughout the drawings, the same components are denoted by like reference numerals, and their repetitive description is omitted if not necessary for the sake of simplicity.

One embodiment of the present invention relates to defect detection inspection of a magnetic disk in a magnetic disk drive device. In the present embodiment, the defect detection inspection for detecting defects according to embodiments of the present invention is explained, taking a hard disk drive (HDD) as an example of the disk drive device. The HDD according to the present embodiment carries out the defect inspection of the magnetic disk by itself while using a circuit and a mechanism thereof. To facilitate the understanding of a feature of this embodiment, the entire configuration of the HDD is first outlined.

FIG. 1 shows a schematic configuration of an entire HDD 1 according to embodiments of the present invention. As shown in FIG. 1, the HDD 1 includes a magnetic disk 11 which is an example of a recording disk (recording medium), a head slider 12, an arm electronics (AE) 13, a spindle motor (SPM) 14, a voice coil motor (VCM) 15, an actuator 16, and a temperature detector 17 in an enclosure 10.

The HDD 1 further includes a circuit board 20 fixed outside the enclosure 10. On the circuit board 20, ICs such as a read/write channel (R/W channel) 21, a motor driver unit 22, an integrated circuit (HDC/MPU) 23 of a hard disk controller (HDC) and an MPU, and a RAM 24. Each circuit can be integrated into one IC or mounted on a plurality of ICs separately.

User data from an external host 51 is received by the HDC/MPU 23, transferred through the R/W channel 21 and the AE 13, and written to the magnetic disk 11 by the head slider 12. The user data stored in the magnetic disk 11 is read out by the head slider 12 and transferred through the AE 13 and the R/W channel 21, and outputted to the external host 51 by the HDC/MPU 23.

The magnetic disk 11 is fixed to the SPM 14. The SPM 14 rotates the magnetic disk at a predetermined angular rate. The motor driver unit 22 drives the SPM 14 in accordance with control data from the HDC/MPU 23. The magnetic disk 11 of the present embodiment has recording surfaces for recording data on both surfaces thereof, and head 12 corresponding to the respective recording surfaces are provided. Each head slider 12 includes a slider floating (flying) over the disk 11, and a head element portion which is fixed to the slider and accesses the recording surface of the magnetic disk 11. Here, the word "access" means "read" or "write", and includes the meanings of both of them. The head element portion of the present embodiment functions as a transducer of a magnetic signal to and from an electric signal. The head slider 12 of the present embodiment includes a heater for thermal fly-height control (TFC) which makes the head element portion protrude by heating to adjust the clearance (fly height) between the head element portion and the magnetic disk 11. The construction of the head slider 12 will be described in detail later, while referring to FIG. 3.

The head sliders 12 are fixed at the tip end portion of the actuator 16. The actuator 16 is coupled to the VCM 15 and pivots around a pivotal axis to move the head sliders 12 in the radial direction of the magnetic disk 11 over the rotating disk. The motor driver unit 22 drives the VCM 15 in accordance with the control data (herein referred to as DACOUT) from the HDC/MPU 23. At least one piece of the magnetic disk 11 is enough and a recording surface can be formed on either surface or both of the magnetic disk 11.

The AE 13 selects the head slider 12 (head element portion) for accessing to the magnetic disk 11 from the plurality of head 12 (head element portions), amplifies (pre-amplifies) a reproduction signal (read signal) reproduced by the selected head slider 12 by a predetermined gain, and sends it to the R/W channel 21. The AE 13 also sends a recording signal (write signal) from the R/W channel 21 to the selected head slider 12. The AE 13 of the present embodiment supplies heater power to the heater in the selected head slider 12. This will be described later in more detail.

In a reading process, the R/W channel 21 amplifies the read signal supplied from the AE 13 to have a predetermined amplitude, extracts data from the obtained read signal, and carries out a decoding process. The data to be read out contain user data and servo data. The decoded read user data is supplied to the HDC/MPU 23. In a writing process, the R/W channel 21 modulates codes of the write data supplied from the HDC/MPU 23, converts the code-modulated write data to the write signal, and supplies it to the AE 13.

With regard to the HDC/MPU 23, the MPU operates in accordance with micro codes loaded in the RAM 24. Starting up of the HDD 1, data required for controlling and data processing as well as micro codes working on the MPU are loaded from the magnetic disk 11 or a ROM (not shown). The HDC/MPU 23 carries out entire control of the HDD 1 in addition to necessary processes concerning data process, such as reading/writing processing control, order management of command execution, positioning control (servo control) of the head 12 utilizing a servo signal, interface control, and defect management. Furthermore, the HDC/MPU 23 determines heater power according to a detected temperature by the temperature detector 17 in its normal operation to carry out clearance control. It particularly manages and controls every step of the defect inspection in the present embodiment. The defect inspection will be described later in detail.

Figure 2:
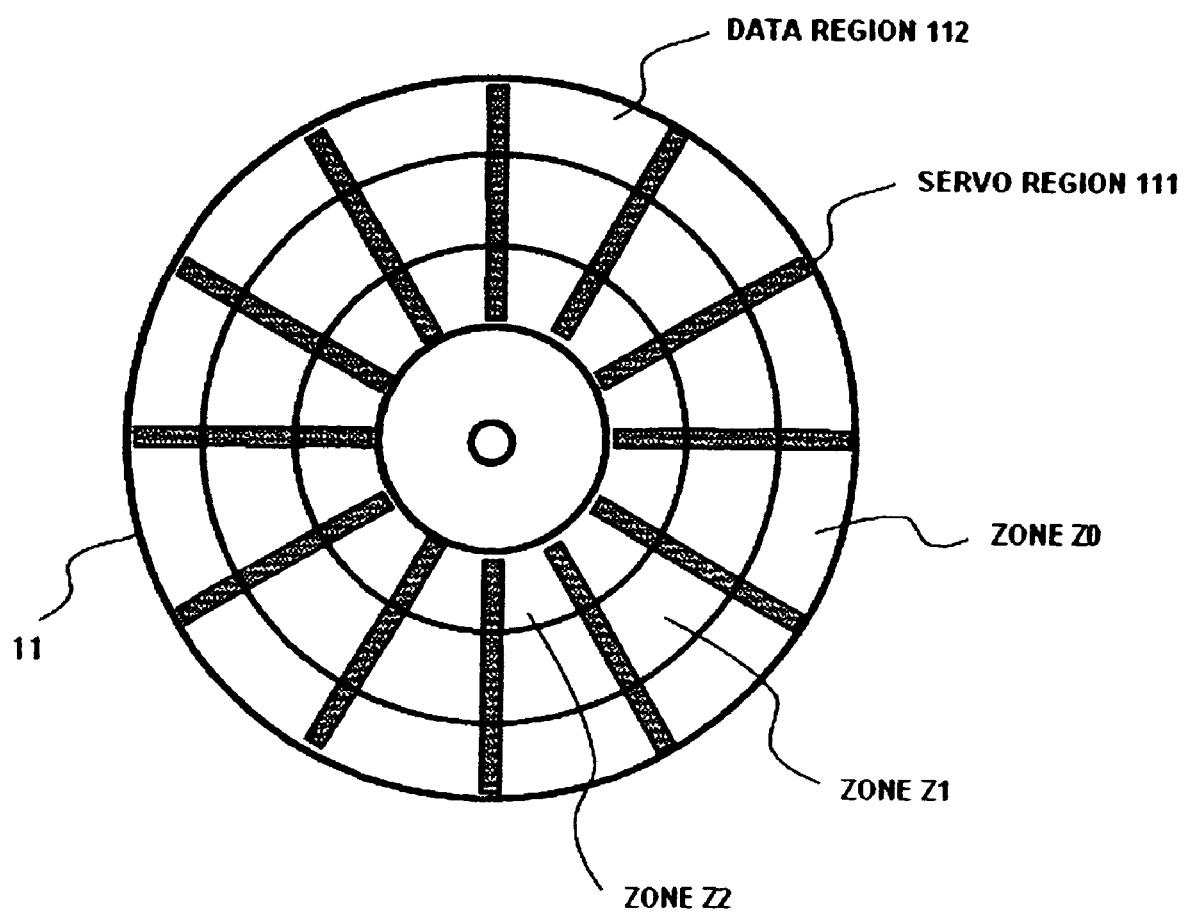
FIG. 2 is a diagram schematically showing the recorded data format on the magnetic disk according to embodiments of the invention.

Now referring to FIG. 2, recorded data on the magnetic disk 11 is explained. FIG. 2 schematically shows at state of recorded data on the recording surface of the magnetic disk 11. As shown in FIG. 2, a plurality of servo regions 111 which extend radially from the center of the magnetic disk 11 and are formed apart at every predetermined angle and data regions 112 provided between two adjoining servo regions 111 are formed on the recording surface of the magnetic disk 11. The servo regions 111 and the data regions 112 are provided alternately at a predetermined angle. Servo data for controlling positioning of the head 12 are recorded in each servo region 111. User data are recorded in each data region 112.

In the servo region 111 and the data region 112, a plurality of concentric tracks having a predetermined width in a radial direction are formed. The servo data and the user data are recorded along a servo track and at data track respectively. The servo track and the data track may be located at the same radial position or different radial positions. Respective servo tracks contain a plurality of servo data placed apart each other at a predetermined angle.

Respective data tracks contain one or more data sectors (recording units of user data) in the data region 112 between the servo regions 111. Here, a data from a servo data to the data sector immediately before the next servo data is referred to as a servo sector. Data tracks are grouped to a plurality of zones Z0 to Z2 in accordance with the radial position of the magnetic disk 11. The number of the data sectors to be included in a data track is determined for the respective zones. In FIG. 2, three zones Z0 to Z2 are illustrated as an example from the outer peripheral side (an OD side) to the inner peripheral side (an ID side). The recording frequency of the OD side zone is set higher than the one of the ID side zone and the recording frequencies are changed at each zone so that recording density of the entire magnetic disk 11 is improved.

Figure 3:
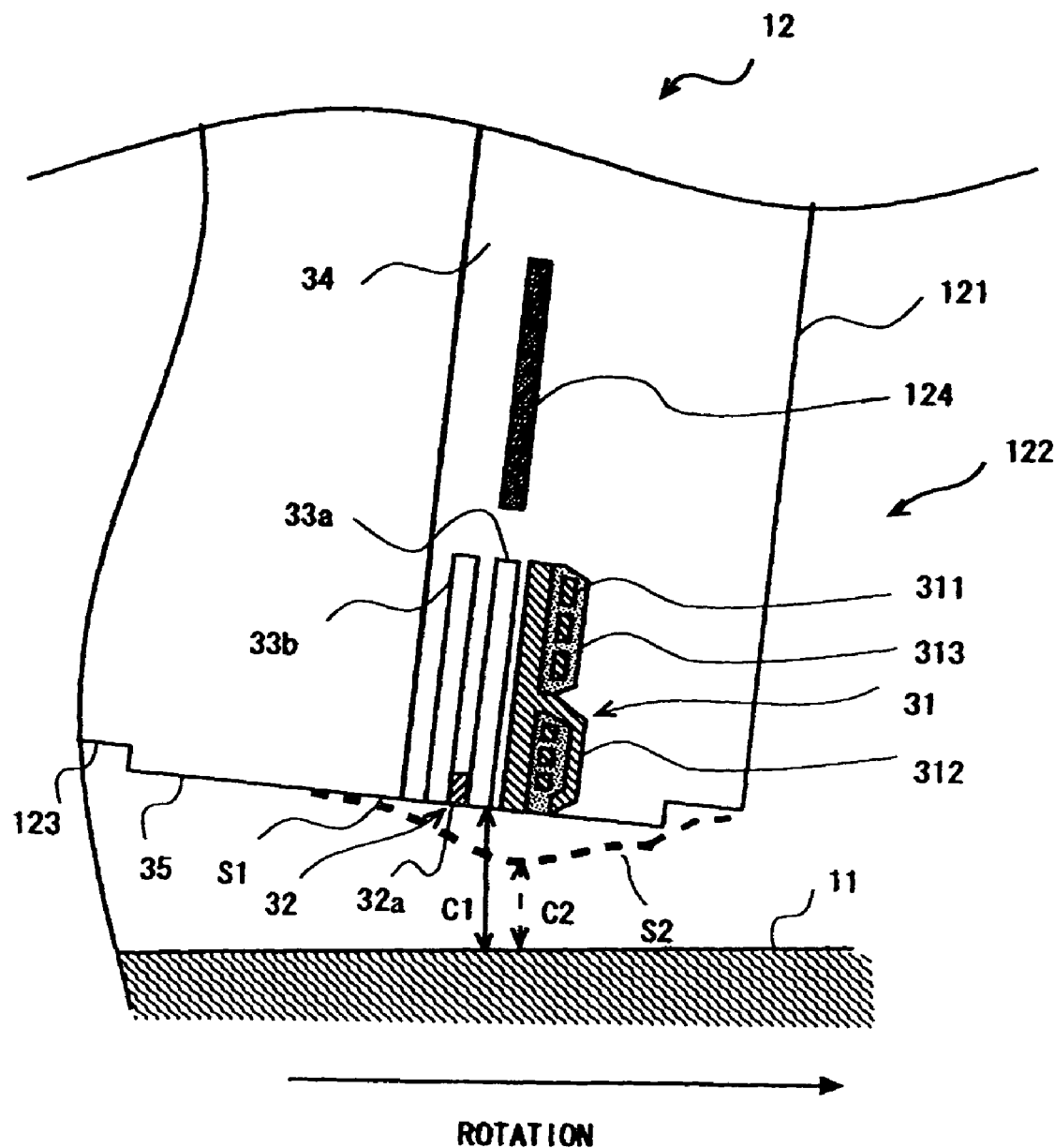
FIG. 3 is a cross sectional view schematically showing the configuration of the head slider including the heater for adjusting the clearance according to embodiments of the invention.

Hereafter, the configuration of the TFC head slider 12 according to the present embodiment is explained. FIG. 3 is a cross-sectional view showing a partial configuration near the air flowing out end surface (trailing side end surface) 121 of the head slider 12. The magnetic disk 11 rotates from the left to the right of FIG. 3. The head slider 12 includes a head element portion 122 and a slider 123 supporting the head element portion 122. The TFC of the present embodiment can be applied to both of the vertical magnetic recording type and the horizontal magnetic recording type of HDDs.

The head element portion 122 reads and writes magnetic data to and from the magnetic disk 11. The head element portion 122 includes a read element 32 and a write element 31 which is located at the trailing, side thereof. The write element 31 is an inductive element, generates a magnetic field between the magnetic poles 312 by current through a write coil 311, and records the magnetic data to the magnetic disk 11. The read element 32 is a magneto-resistive element, contains a magneto-resistive element 32a with magnetic anisotropy, and reads out the magnetic data recorded in the magnetic disk 11 in accordance with its resistance which is variable due to the magnetic field from the magnetic disk 11.

The head element portion 122 is formed by a thin film forming process such as coating, sputtering, and polishing on an AlTiC substrate forming the slider 123. The magneto-resistive element 32a is sandwiched between magnetic shields 33a and 33b, and the write coil 311 is surrounded by an insulating film 313. The head element portion 122 includes a protective film 34 made of alumina, etc. around the write element 31 and the read element 32, and the entire head element portion 122 is protected by the protective film 34. A heater 124 made of a thin film resistive element is formed by a thin film forming process near the write element 31 and the read element 32. In the present embodiment, the heater 124 is located at the far side of the head element portion 122 from the magnetic disk 11. A thin film resistive element using Permalloy can be winded and bury the gap with alumina to form the heater 124.

When the AE 13 applies current (supplies electric power) to the heater 124, the surrounding part of the head element 122 protrudes to change its shape due to the heat by the heater 124. Adjusting the supply power to the heater 124 results in controlling the clearance between the head element portion 122 and the recording surface. This is referred to as thermal fly height control (TFC). When the heater is not heated or heated with smaller heater power, an air bearing surface (ABS) of the head slider 12 is shaped as illustrated by S1 and the clearance which is a gap between the head element portion 122 and the magnetic disk is illustrated by C1.

The protruding shape S2 at the time the heater 124 is heated or the heater power is increased is schematically illustrated by a dashed line in FIG. 3. The head element portion 122 comes close to the magnetic disk 11 and the clearance C2 at this time is smaller than the clearance C1. Here, FIG. 3 is conceptual and the dimensions are not actual. For example, in the protruding surface shape S2, the protruding amount is on the order of a nanometer (several manometers).

As described above, the HDC/MPU 23 controls the heater 124. In a normal operations the HDC/MPU 23 sets a value indicating the heater power to the resister of the AE 13 in accordance with the detected temperature by the temperature detector 17 and each step of the reading/writing process. The AE 13 supplies the set value of the heater power to the heater 124. Normally, the heater power decreases as the temperature rises and the heater power at the time of writing is smaller than the one at the time of reading.

Hereinbelow, the defect inspection of the magnetic disk 11 according to the present embodiment is described in detail. The HDD 1 of the present embodiment carries out the defect inspection of the magnetic disk 11, using the TFC. Changing the clearance by the TFC enables defect detection tests under varied test conditions without much decrease of throughput in manufacturing HDDs. Specifically, in the defect detection test of the magnetic disk according to the present embodiment, the recording surface is tested with different clearances which are adjusted by the TFC. Thereby, defects on the recording surface can be detected more accurately.

The HDD 1 of the present embodiment carries out the defect inspection of the magnetic disk 11 by itself. In the present specification, it is referred to as self run self test (SRST). The HDD 1 conducts the SRST using its mechanical parts and a control circuit implemented as a product. In the manufacturing process of the HDD 1, necessary components such as the magnetic disk 11, the head 12, and the actuator 16 are mounted in the enclosure 10 to manufacture a head disk assembly (HDA). Further, a control circuit board 20 on which necessary circuits are implemented is loaded to the HDA. The HDD 1 assembled as a product carries out the SRST using the circuits and the mechanisms thereof.

The SRST conducts some types of defect detection tests to the recording surfaces of the magnetic disk 11. In the preset embodiment, a so-called surface analysis test (SAT) is explained as a preferred example to which the embodiments of present invention are applicable. To outline the SAT, data is written in each data track of the magnetic disk 11 and read out so that the defects on the recording surface are located.

The SAT of the present embodiment is conducted to all of the tracks and the sectors in the HDD 1. The detected defected sectors are registered in a defect table. The HDD does not access the sectors registered in the defect table and skips the defect sectors. The SRST of the present embodiment is conducted in a test chamber and the inside of the test chamber is maintained at substantially the same temperature and air pressure conditions. Typically, the SRST is conducted at a high temperature around 50° C. in at normal pressure.

The SAT is constructed by three tests, for example. The HDD 1 carries out a sequential SAT, an ODD/EVEN SAT, and a normal SAT. The normal SAT detects defects of the data tracks by performing writing and reading processes to each track by a normal data pattern of the assembled product. The sequential SAT sequentially writes data to each data track. Then, it reads out the data sequentially from the data track written to first. The access sequence is started from the OD side or the ID side data track. If a predetermined error occurs, it registers the data sector or the series of data sectors as defected sectors. The ODD/EVEN SAT writes data to the target data track, then writes data to the both adjacent data tracks thereof. It reads out the data from the target track to detect the defects of the target track. It sequentially carries out this process to each data track.

Figure 4A:
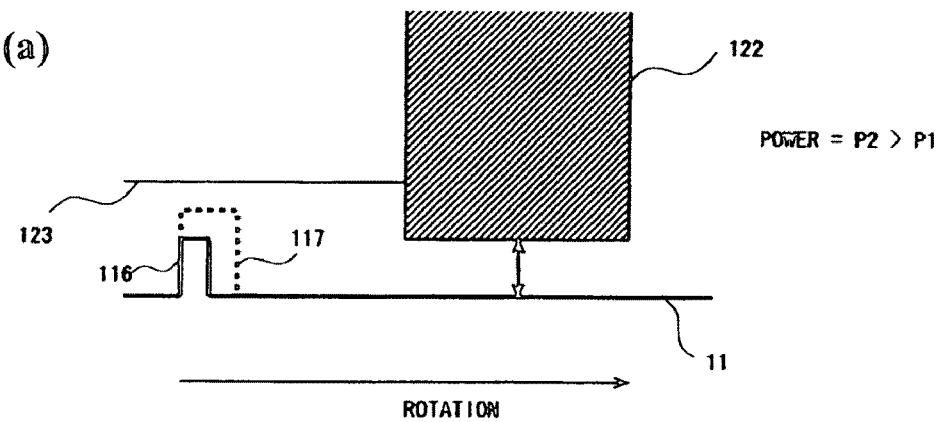
FIGS. 4($a$) and 4($b$) are diagrams schematically showing a preferred example of the surface analysis test using the TFC according to embodiments of the invention.
Figure 4B:
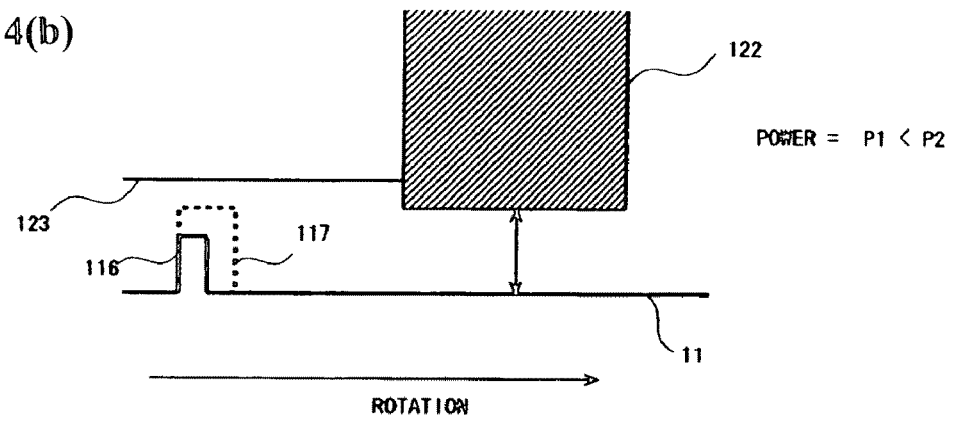

Referring to FIGS. 4(a) and 4(b), a preferred example of the SAT using the TFC is explained. The HDD 1 of this example conducts the SAT in a state that heater power of P2 is supplied to the heater 124, as shown in FIG. 4(a). Then, the HDD 1 conducts the SAT in a state that heater power of P1 is supplied to the heater 124. The respective heater powers are values at the step of reading data.

The HDD 1 carries out the tests with different heater powers respectively in the above-described normal SAT, sequential SAT and ODD/EVEN SAT. Here, in the respective types of SATs, the tests at the heater powers P2 and P1 are preferably carried out to every data track. That is, the HDD 1 reads data of the target data track with the above-described two different heater powers sequentially, and then moves to test the next target track. Thereby, a seek process can be omitted so that the test time is shortened. This is the same in the other examples below.

As shown in FIGS. 4(a) and 4(b), the heater power P2 is larger than the heater power P1. In this example, the heater power P1 is a heater power at a normal operation of the HDD 1 after product delivery. That is, the HDD 1 supplies the heater power of P1 to the heater 124 when reading the data at the same temperature as the one in the test. In the examples of FIGS. 4(a) and 4(b), the head element portion 122 is protruded from the ABS of the slider 123 toward the recording surface at the heater powers P1 and P2. The head element portion 122 may back off from the ABS.

The head element portion 122 protrudes more toward the recording surface at the heater power P2 than at the heater power P1 so that the clearance is smaller. Thereby, the test at the heater power P2 can detect a projection 116 more accurately than the test it the heater power P1. Bumping of the head slider 12 against the projection 116 results in that the projection 116 on the recording surface appears as a so-called thermal asperity (TA) in the read signal.

Therefore, it is important to accurately detect this defect beforehand. The projection 116 is sometimes too small to be detected as the TA, and it grows by adhesion of a smear 117 in the HDD 1 to appear as the TA after its product delivery. As described above, decreasing the clearance by the higher heater power P2 enables more accurate detection of small projections at the SAT.

Figure 5A:
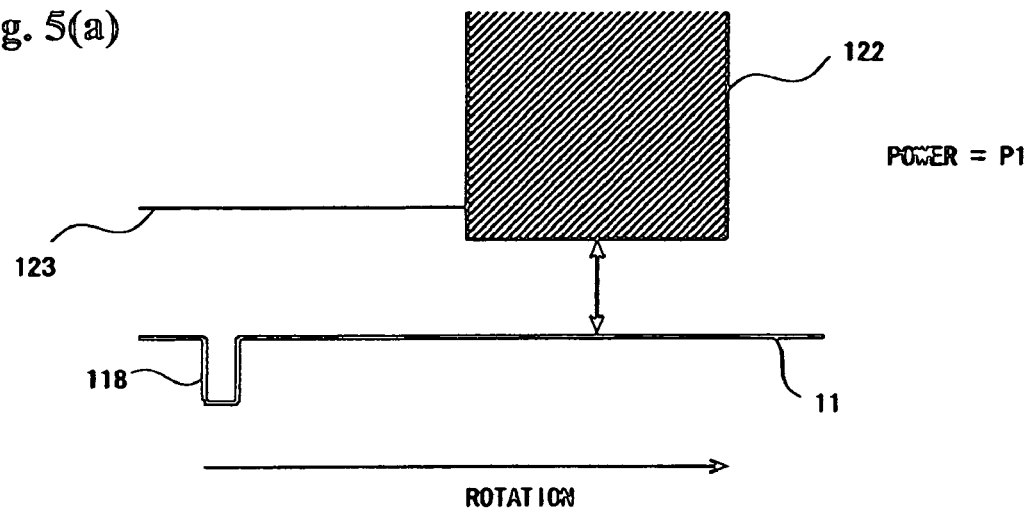
FIGS. 5($a$) and 5($b$) are diagrams schematically showing another preferred example of the surface analysis test using the TFC according to an embodiment of the invention.
Figure 5B:
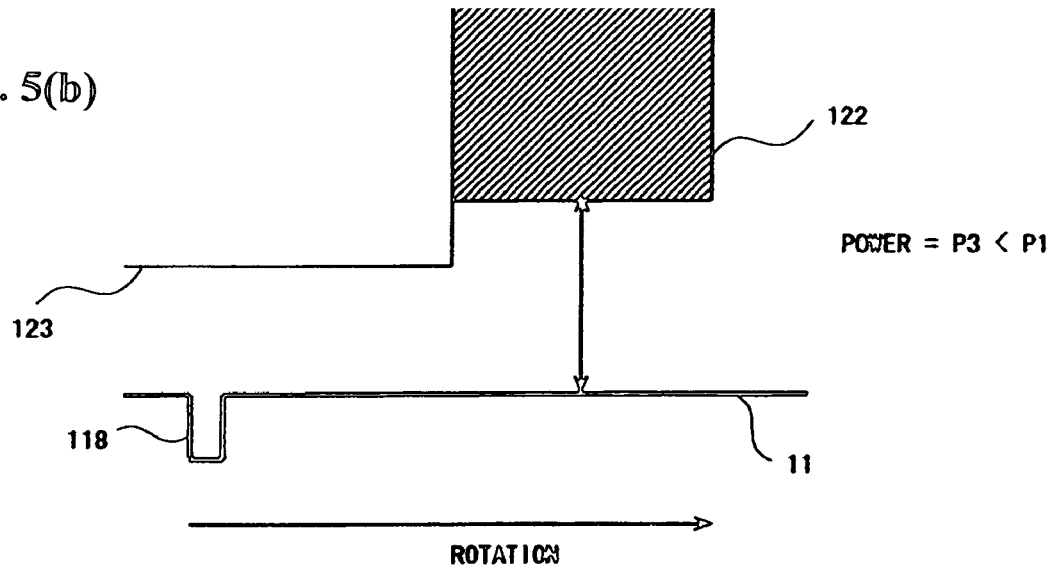

Next, referring to FIGS. 5(a) and 5(b), another preferred example of the SAT using the TFC is explained. The HDD 1 of this example carries out the SAT in a state that the heater power P1 is supplied to the heater 124 as shown in FIG. 5(a). The P1 is the same as the P1 in the example described with referring to FIG. 4. Then, the HDD 1 carries out the SAT in a state that the heater power P3 is supplied to the heater 124.

As shown in FIGS. 5(a) and 5(b), the heater power P3 is smaller than the heater power P1. The preferable heater power P3 is substantially 0. In the example of FIG. 5(b), the head element portion 122 backs off from the ABS at the heater power P3. However, the head element portion 122 may protrude from the ABS at the heater power P3.

As defects of the magnetic disk, a hole (bore) 111 called a scratch, exists as well as the projection 116. When the scratch 118 is present, the effective clearance increases so that the read signal becomes too small to read the data correctly. Or, errors such that the magnetic field for writing becomes too small to write the data accurately occur. Thus, it is important that the scratches are accurately detected in the test steps.

In this example, the SAT at a smaller power value of the heater power P3 is carried out. The clearance at the heater power P3 is larger than at the heater power P1 so that the head element portion 122 is not likely to be able to read data correctly in the region where the scratch 118 exists. That is, the SAT at the heater power P3 can detect the scratch 118 more accurately.

Figure 6A:
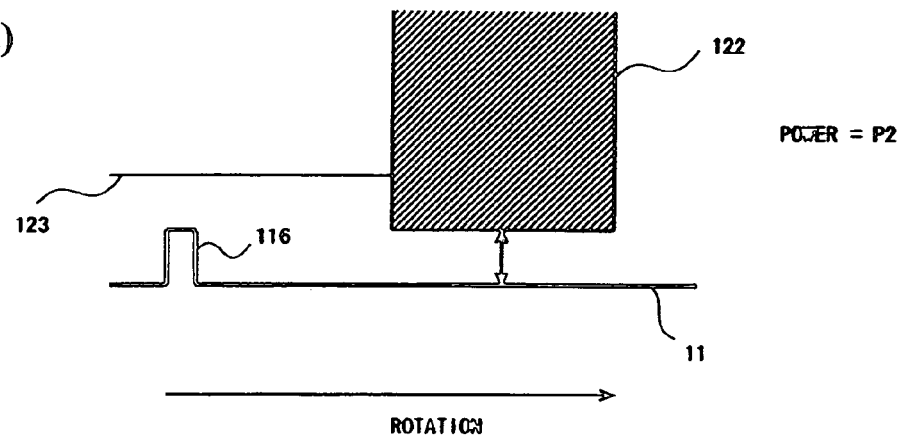
FIGS. 6($a$) and 6($b$) are diagrams schematically showing yet another preferred example of the surface analysis test using the TFC according to embodiments of the invention.
Figure 6B:
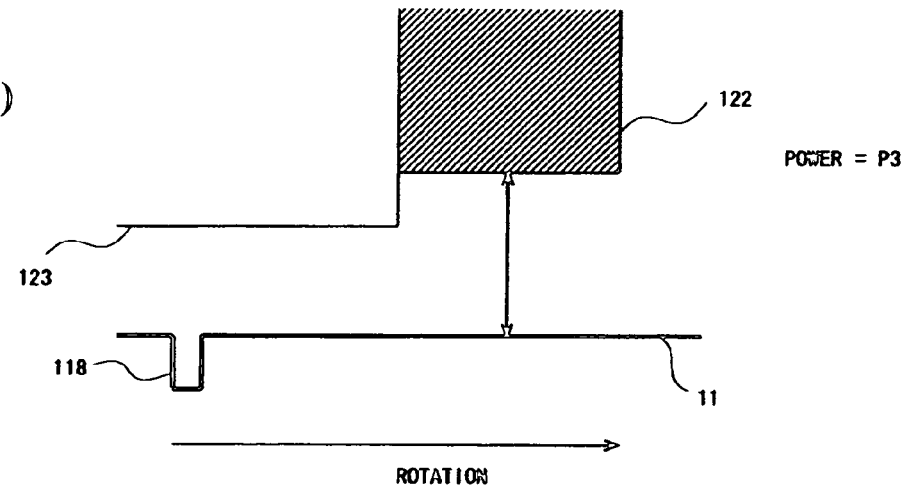

Next, referring to FIGS. 6(a) and 6(b), yet another preferred example of the SAT using the TFC is explained. The HDD 1 of this example carries out the SAT in a state that the heater power P2 is supplied to the heater 124 as shown in FIG. 6(a). Then, the HDD 1 carries out the SAT in a state that the heater power P3 is supplied to the heater 124. The P2 is the same as the P2 in the example described with referring to FIG. 4 and the P3 is the same as the P3 in the example described with referring to FIG. 5. Accordingly, the heater power P2 is larger than the heater power P3. The clearance at the heater power P2 is smaller than the clearance at the heater power P3.

The heater power P2 is larger than the normal heater power P1 and the clearance is smaller. Therefore, the test with this heater power can detect the projections 116 with fewer failures. Moreover, the heater power P3 is smaller than the normal heater power P1 and the clearance is larger. Therefore, the test with this heater power can detect the scratches 118 with fewer failures. Thus, the respective defect detection tests at the larger heater power P2 and at the smaller heater power P3 than the heater power P1 which is applied in the normal operation under the same conditions enable more accurate detection of the defects on the recording surface.

The heater powers P2 and P3 can be determined according to the specification of the HDD 1. For example, the heater power P3 is determined corresponding to the largest clearance in the design specification of the HDD and the heater power P2 is determined corresponding to the smallest clearance. At the lowest temperature and the lowest altitude in the specification, the clearance becomes the largest. On the other hand, at the highest temperature and the highest altitude in the specification, the clearance becomes the smallest. Determining the heater power in the above described way enables the test under the severest condition within the expected range of use of the HDD 1 so that effective defect detection of the magnetic disk and effective error suppression after product delivery can be achieved.

Figure 7A:
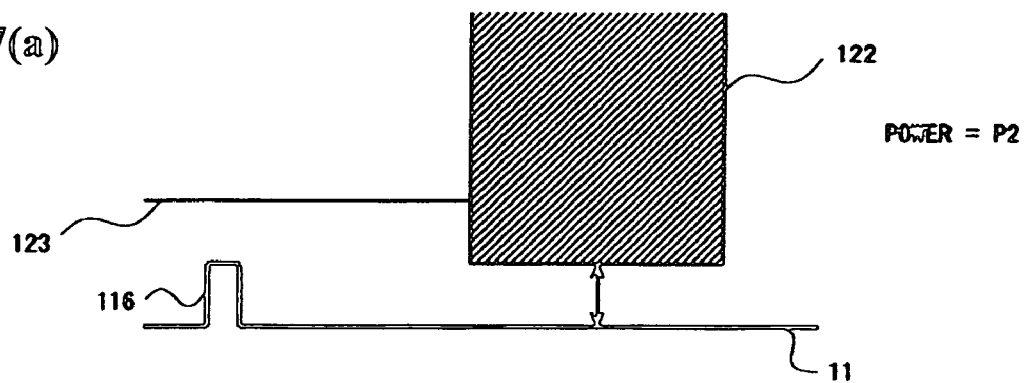
FIGS. 7($a$)-7($c$) are diagrams schematically showing yet another preferred example of the surface analysis test using the TFC according to embodiments of the invention.
Figure 7B:
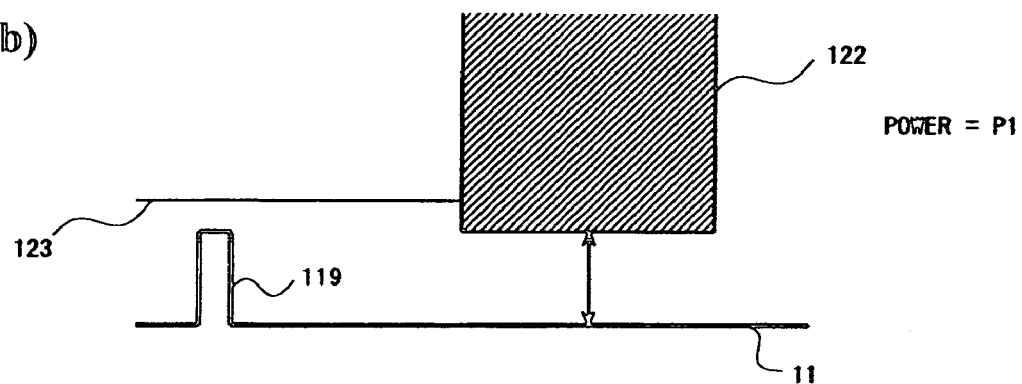
Figure 7C:
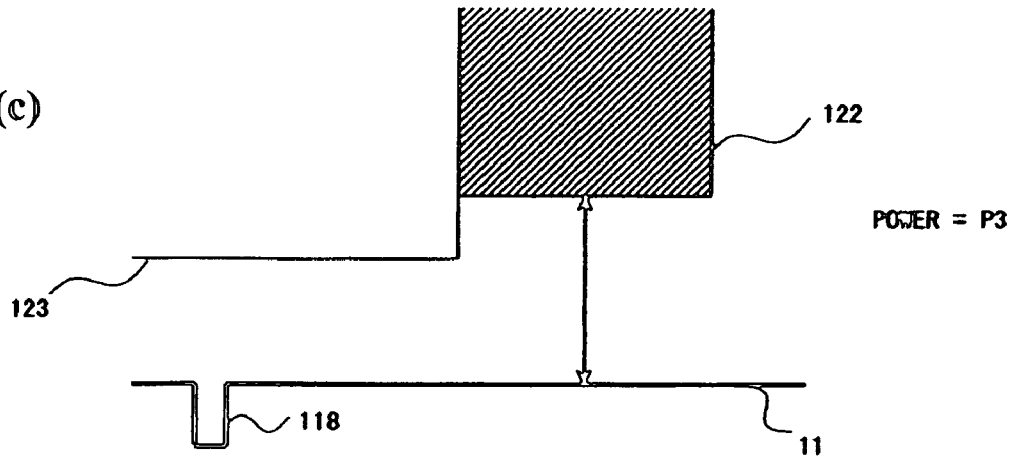

Now referring to FIGS. 7(a), 7(b), and 7(c), yet another preferred example of the SAT using the TFC is described. The SAT of the present example carries out tests using three different heater powers. In addition, the SAT of the present example preliminarily registers a part of the defects (defect candidates) as defect candidates which are detected as projections in the test. The HDC/MPU 23 does not register the defect candidates in the defect table but in a different defect candidate table. The HDC/MPU 23 does not skip the sectors of the defect candidates but uses the sectors to store data in a normal operation. The defect candidate table is produced in the RAM 24 at the time of the test, and is recorded in a predetermined region of the magnetic disk 11 after completion of the test. This is the same as the defect table.

The HDC/MPU 23 conducts the test on the registered sectors as the defect candidates in an idling state after delivery, for example. When all error is detected in the test, the HDC/MPU 23 relocates the data in the sector to another sector and registers the sector where the error is detected as a defect sector in the table. The HDC/MPU 23 accesses the reassigned sector instead of the sector registered as a defect.

Preliminary registration of the defect candidates results in reducing the number of sectors or entries to be registered as defects. Because the number of entries which can be registered in the defect table is limited, suppressing the number of defects to be registered can avoid overflow of the defect table.

As described above, especially the projections 116 on the recording surface may grow with the time of use of the HDD 1. Therefore, the small projections are preferably registered preliminarily as defect candidates at the time of the test. In addition, they are preferably registered as defects before the small projections grow much enough to cause fatal troubles in the actual reading/writing process with elapse of the time of use after product delivery.

In a preferred example, the HDC/MPU 23 actually reads the sectors of the defect candidates and determines whether the TA is detected or not. At this time, the HDC/MPU 23 preferably performs the control so that a larger heater power is supplied to the heater 124 than in the normal operation at the detected temperature by the temperature detector 17. This enables defect registration before the projections 116 grow enough to cause the errors in the normal operation. Typically, the RW channel 21 includes a circuit (function) to detect the TA and notifies the result to the HDC/MPU 23. The HDC/MPU 23 may register a sector as a defect sector not to be used and perform the above-described reassigning process when errors occur more than a predetermined number of times in the sector registered as the defect candidate.

In the SAT, it is preferable to detect the small projections for preliminary registration as defect candidates as well as the projections, as described above. In this example, tests with different heater powers P1 and P2 enable detection of the small projections. Specifically, the HDD 1 carries out the test with the heater power P2 as shown in FIG. 7(a). Then, the HDD 1 carries out the test with the heater power P1 as shown in FIG. 7(b). The test with the heater power P1 may be performed on the whole region of the recording surface of the test subject, but it is preferably performed on each region where the defects are detected by the test with the heater power P2, or performed on the regions where the defects are detected by the test with the heater power P2 and their peripheral regions of the predetermined sector numbers and cylinder numbers.

The clearance is larger at the test with the heater power P1. Therefore the test with the heater power P1 detects relatively large projections 119 but does not detect small projections 116. The defects which the test with the heater power P2 detects but the test with the heater power P1 does not detect can be considered to result from the small projections 116. The projections can be detected by the TA detection function of the RW channel 21 as described above.

The HDC/MPU 23 stores the addresses of the defects which were detected in the test with the heater power P2 in the RAM 24. After that, the HDC/MPU 23 carries out the test with the heater power P1 on the defects detected in the test with the heater power P2. The HDC/MPU 23 registers the defects detected in the test with the heater power P1 in the defect table. Further, the HDC/MPU 23 registers the remaining defects which were detected in the test with the heater power P1 but were not detected in the test with the heater power P2 in the defect candidate table.

The HDC/MPU 23 then carries out a test with the heater power P3 as shown in FIG. 7(c). The heater power P3 is smaller than the heater powers P1 and P2 and the test with the heater power P3 can effectively detect defects by the scratches 118. The HDC/MPU 23 registers all the defects detected by the test with the heater power P3 in the defect table. Because the scratches 118 do not grow like the projections 116, it is preferable to register all the defects detected by the SAT in the defect table.

The SATs described with referring to FIGS. 4 to 6 perform the defect detection tests in the state that the larger heater power has been supplied to the heater 124 and then perform the detect detection tests in the state that the smaller heater power has been supplied to the heater 124. The SAT described with referring to FIG. 7 performs the tests with the larger heater powers P1 and P2 first, and then performs the test with the smaller heater power P3. The test with the larger heater power is suitable for detecting the projections 116 and the test with the smaller heater power (especially at P3) is suitable for detecting the scratches 118. In the preferred embodiment, the HDC/MPU 23 selects a part of the regions which the test with the larger heater power inspected based on the defects detected by the test with the larger heater power. Then, the test with the smaller heater power is carried out on the selected data region. Thereby, the test time can be shortened.

The scratches 118 generally result from a texture process in manufacturing processes of the magnetic disk 11. The texture process is a mechanical process to form magnetic an isotropy along the circumferential direction on a magnetic layer of the magnetic disk 11. Specifically, the substrate of the magnetic disk 11 is scrubbed by a tape in a state that the substrate before a sputtering process is being rotated. The tape moves back and forth in the radial direction of the magnetic disk 11. Therefore, the scratches 118 are generated to draw a sign curve along the peripheral direction as shown in FIG. 8.

Figure 8:
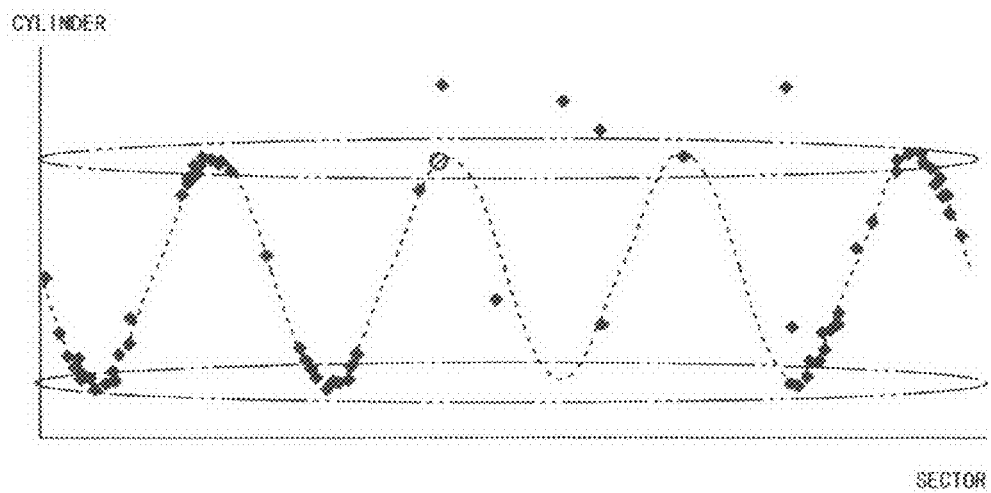
FIG. 8 schematically shows a part of the defects registered in the defect table as a result of the SAT with respect to a recording surface in the HDD without the TFC function implemented.

FIG. 8 shows a part of the defects registered in the defect table as a result of the SAT on one recording surface in the HDD without the TFC function. In FIG. 8, the x-axis represents the number of sectors, and the y-axis represents the number of tracks (number of cylinders). That is, the direction of the x-axis corresponds to the circumferential direction and the direction of the y-axis corresponds to the radial direction. In FIG. 8, the black diamonds denote the sectors registered in the defect table as the result of the test. The white circle denotes the sector which was not registered in the defect table in the test but became an error under actual use at a low temperature.

From researches by the inventors so far, it is found that many defects are detected at the peaks and the valleys of the sign curve by the texture process and that the probability that the defects are not correctly detected at these positions is high. Since these defects are scratches, they can be detected more correctly by the test with the large clearance. Therefore, carrying out the test with the smaller heater power on a partial region selected to include these regions achieves effective defect detection and the shortened test time.

The HDC/MPU 23 selects tracks (cylinders) for test subjects at the smaller heater power based on the defects detected by the tests at the larger heater power. The region to be a test subject is a part of the test subject region at the larger heater power. The test with the larger heater power can detect scratches 118 but is likely to overlook a part of the scratches 118. Therefore, the HDC/MPU 23 locates the regions including the peaks or the valleys shown in FIG. 8 from the locations of defects detected by the test with the larger heater power and conducts the test with the smaller heater power on the located region.

A preferred method to determine the test subject region so as to include the peaks or the valleys is to determine the selection region according to the density of the defects detected in the test with the larger heater power. For example, The HDC/MPU 23 quantizes the defects detected in the test with the lager heater power every predetermined number of cylinder. That is, the HDC/MPU 23 divides the recording surface into regions of the predetermined number of cylinders and determines the number of defects (density) in the respective divided regions. Referring to the frequency distribution obtained like this, the HDC/MPU 23 locates a unit region which includes more than the reference number of defects.

Figure 9:
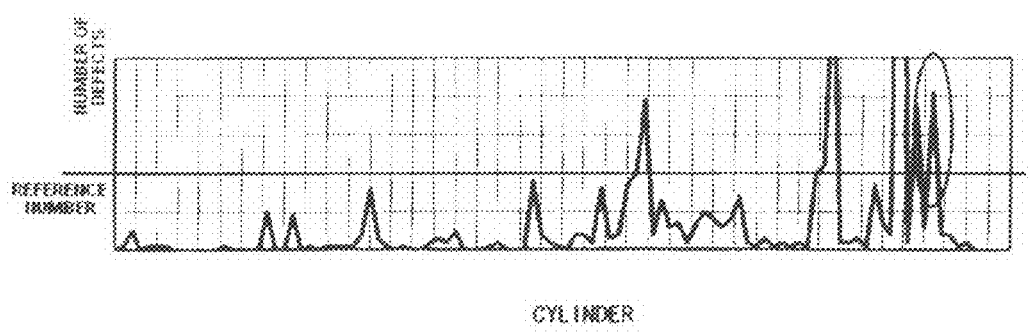
FIG. 9 shows a histogram which is obtained from the number of the defect sectors located on every 500 cylinders in view of the test result data corresponding to the graph of FIG. 8.

FIG. 9 shows a histogram which is obtained by counting the number of the defect sectors located on every 500 cylinders of the test result data corresponding to the graph of FIG. 8. For example, the number of the defect sectors of the region of cylinders 0-499 is shown as the number of the defect sectors corresponding to the cylinder 249. The region surrounded by an ellipse in FIG. 9 corresponds to the peaks and the valleys in FIG. 8. As shown in FIG. 9, selective tests on the regions which include more than the predetermined number of defects enables testing of the regions including the peaks and the valleys. Specifically, an appropriate reference number is determined when the HDD 1 is designed, and the HDC/MPU 23 conducts tests with the smaller heater power on the respective unit regions which include more defects than the reference number.

Otherwise, the HDC/MPU 23 may locate the cylinder number where the corresponding number of the defects are more than the reference number and carry out the test with the smaller heater power on the predetermined region around the cylinder number. For example, when the number of the defect sectors in the region of cylinders 999 to 1499 is more than the reference number, the HDC/MPU 23 may carry out the test with the smaller heater power on the predetermined region which is different from the above-described unit region centered by the cylinder 1249.

As set forth above, the present invention is described by way of preferred embodiments but is not limited to the above embodiments. A person skilled in the art can easily modify, add, and convert the each element in the above embodiments within the scope of the present invention. For example, the defect test according to one embodiment is suitable for the SRST but is applicable to other tests on the magnetic disk. Besides, the test may be performed with using a control circuit for the test purpose only instead of using the control circuit as a product of the HDD 1. The device including the control circuit for the test purpose configures the magnetic disk drive.

The defect detection test within the HDD after product delivery is preferably carried out on the defect candidates which have been preliminarily registered but may be carried out independently from the preliminary registration process. That is, a test using the TFC can be made within the HDD after product delivery irrespective of the test on the magnetic disk before product delivery. In the above-described example, P1 is the heater power value at the normal operation, but the heater power P1 in the above examples may be a different value. Besides, the projections for registration as defect candidates may be detected by using other methods than the above-described method. The region to be selectively inspected can be determined by using other methods than the above-described method.

What is claimed is:

1. A method for inspecting the magnetic disk for defects in a magnetic disk drive device comprising a slider flying over a rotating magnetic disk, a head element portion placed on the slicer, a heater placed on the slider and making the head element portion protrude by a thermal expansion to adjust a clearance between the magnetic disk and the head element portion, the method comprising:
   conducting a defect inspection of a recording surface of the magnetic disk with the head element portion accessing the recording surface in a state that a heater power value of the heater is a first value; and
   conducting a defect inspection of the recording surface of the magnetic disk with the head element portion accessing the recording surface in a state that the heater power value of the heater is a second value which is different from the first value.

2. The method according to claim 1, wherein the defect inspection with the second value is conducted with respect to a part of a region selected from the region on which the defect inspection with the first value was conducted.

3. The method according to claim 2, wherein the first value is larger than the second value.

4. The method according to claim 3, further comprising preliminarily registering at least a part of the defects detected in the inspection in the state that the heater power of the heater is the first value as defect candidates.

5. The method according to claim 2, wherein the part of the region is selected based on a result of the defect inspection with the first value.

6. The method according to claim 2, wherein the part of the region is selected based on a density of the defects which are detected in the defect inspection with the first value.

7. The method according to claim 1, wherein
the first value is larger than the heater power value at a normal operation of the magnetic disk drive device at a same temperature as the inspection; and
the second value is smaller than the heater power value at the normal operation of the magnetic disk drive device at a same temperature as the inspection.

8. A device for inspecting a magnetic disk for defects comprising:
a slider flying over a rotating magnetic disk;
a head element portion placed on the slider;
a heater placed on the slider and making the head element portion protrude by a thermal expansion to adjust a clearance between the magnetic disk and the head element portion; and
a controller conducting a defect inspection of the magnetic disk with the head element portion accessing a recording surface of the magnetic disk in a state that a heater power value of the heater is a first value, and further conducting a defect inspection of the recording surface with the head element portion accessing the recording surface in a state that a heater power value of the heater is a second value which is different from the first value.

9. The device according to claim 8, wherein the controller conducts the defect inspection with the second value with respect to a part of a region selected from the region on which the defect inspection was conducted with the first value.

10. The device according to claim 9, wherein the first value is larger than the second value.

11. A magnetic disk drive device comprising:
a slider flying over a rotating magnetic disk;
a head element portion placed on the slider;
a heater placed on the slider and making the head element portion protrude by a thermal expansion to adjust a clearance between the magnetic disk and the head element portion; and
a controller conducting a defect inspection of the magnetic disk with the head element portion accessing the magnetic disk in a state that a heater power value of the heater is different from a heater power value at a normal operation.

12. The magnetic disk drive device according to claim 11, wherein the heater power value at the defect inspection is smaller than the heater power value at the normal operation.

13. The magnetic disk drive according to claim 11, wherein the controller conducts the defect inspection on sectors preliminarily registered as defect candidates.

* * * * *

UNITED STATES PATENT AND TRADEMARK OFFICE
CERTIFICATE OF CORRECTION

PATENT NO.        : 7,636,217 B2
APPLICATION NO.   : 11/900708
DATED             : December 22, 2009
INVENTOR(S)       : Uji et al.

It is certified that error appears in the above-identified patent and that said Letters Patent is hereby corrected as shown below:

Column 1, line 26, please delete "all HDD" and insert -- an HDD --

Column 1, line 46, please delete "at different condition" and insert -- a different condition --

Column 1, line 67, please delete "all HDD" and insert -- an HDD --

Column 2, line 47, please delete "a device therefore and" and insert -- a device therefor, and --

Column 3, line 26, please delete "laying over" and insert -- flying over --

Column 3, line 26, "disks" should read -- disk, --

Column 3, line 27, please delete "healer" and insert -- heater --

Column 3, line 33, please delete "in at state" and insert -- in a state --

Column 3, line 45, please delete "making, the head element" and insert -- making the head element --

Column 5, line 36, please delete "at state" and insert -- a state --

Column 5, line 51, please delete "at data" and insert -- a data --

Column 6, line 17, please delete "trailing, side" and insert -- trailing side --

Column 6, line 61, please delete "manometers" and insert -- nanometers --

Column 7, line 42, please delete "in" and insert -- and --

Column 8, line 22, please delete "it" and insert -- at --

Column 9, line 45, please delete "all error" and insert -- an error --

Column 11, line 49, please delete "lager" and insert -- larger --

CERTIFICATE OF CORRECTION (continued)
U.S. Pat. No. 7,636,217 B2

Claim 1, column 12, line 45, please delete "slicer" and insert -- slider --

Signed and Sealed this

Sixteenth Day of March, 2010

David J. Kappos
*Director of the United States Patent and Trademark Office*